(12) United States Patent
LaFontaine et al.

(10) Patent No.: US 6,696,847 B1
(45) Date of Patent: Feb. 24, 2004

(54) PHOTO ASSISTED ELECTRICAL LINEWIDTH MEASUREMENT METHOD AND APPARATUS

(75) Inventors: Bruno M. LaFontaine, Pleasanton, CA (US); Jongwook Kye, Pleasanton, CA (US); Harry Levinson, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 63 days.

(21) Appl. No.: 09/907,311

(22) Filed: Jul. 17, 2001

(51) Int. Cl.$^7$ ............................. G01R 31/302; G01R 27/14
(52) U.S. Cl. ..................... 324/752; 324/501; 324/719
(58) Field of Search .......................... 324/752, 719, 324/500, 501, 765, 716

(56) References Cited

U.S. PATENT DOCUMENTS

| | | | | |
|---|---|---|---|---|
| 4,320,289 A | * | 3/1982 | White et al. | 250/214 R |
| 6,043,893 A | * | 3/2000 | Treiman et al. | 356/402 |
| 6,066,952 A | * | 5/2000 | Nowak et al. | 324/458 |
| 6,160,407 A | * | 12/2000 | Nikawa | 324/752 |
| 6,320,396 B1 | * | 11/2001 | Nikawa | 324/752 |
| 6,456,082 B2 | * | 9/2002 | Nowak et al. | 324/719 |

OTHER PUBLICATIONS

Characterizationof Line Width Variation, Alfred K. Wong, Antoinette F. Molless, Timothy A. Brunner, Eric Coker, Robert H. Fair, George L. Mack, Scott M. Mansfield, Optical Microlithography XIII, Proceedings of SPIE vol. 4000 (month unavailable)(2000), pp. 184–191.

Electrical Critical Dimension Metrology for 100–nm Linewidths and Below, Andrew Grenville, Brian Coombs, John Hutchinson, Kelin Kuhn, David Miller, Patrick Troccolo, Optical Microlithography XIII, Proceedings of SPIE vol. 4000 (month unavailable)(2000), pp. 452–459.

* cited by examiner

Primary Examiner—Ernest Karlsen

(57) ABSTRACT

In the present method of electrically testing the width of a line, a short pulse of laser energy is applied to the line to generate conductive electrons therein. An electrical potential is applied to the line to cause electrons to flow in the line, and current is measured to determine the width of the line.

5 Claims, 4 Drawing Sheets

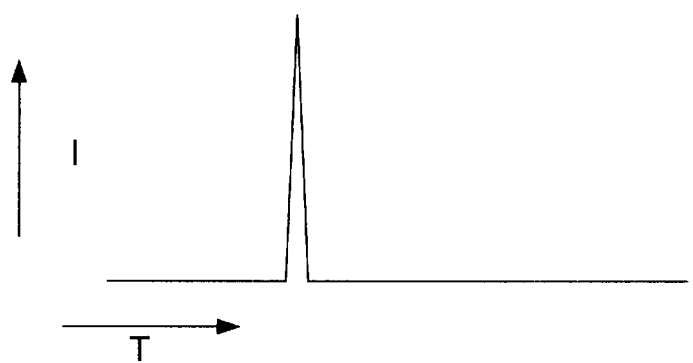
FIGURE 12A
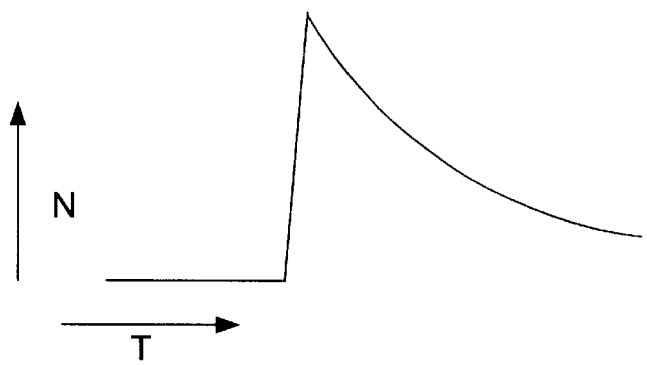
FIGURE 12B
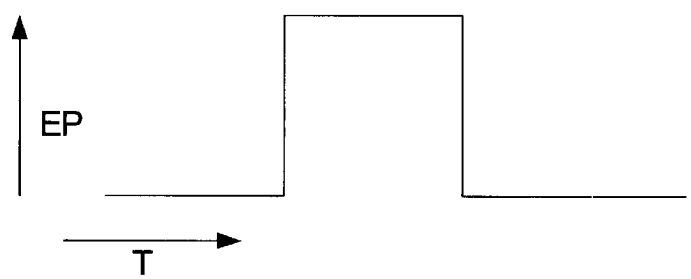
FIGURE 12C
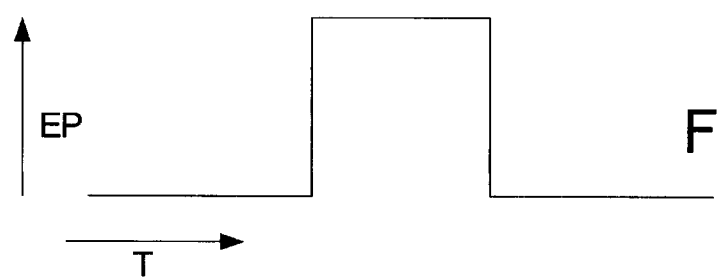
FIGURE 12D
FIGURE 12

PHOTO ASSISTED ELECTRICAL LINEWIDTH MEASUREMENT METHOD AND APPARATUS

BACKGROUND OF THE INVENTION

1. Field of the Invention

This invention relates generally to testing of semiconductor structures, and more particularly, to electrical linewidth measurement.

2. Discussion of the Related Art

The paper "Characterization of line width variation" by Alfred K. Wong, Antoinette F. Molless, Timothy A. Brunner, Erik Coker, Robert H. Fair, George L. Mack and Scott M. Mansfield, Optical Microlithography XIII, Proceedings of SPIE Vol. 4000(2000), pages 184–191, discusses the importance of controlling line width in semiconductor devices. As pointed out therein, control of line width variation is of the increasing concern as device critical dimension (CD) shrinks rapidly and optical lithography is used for printing features at an ever smaller fraction of the wavelength of light.

The paper "Electrical Critical Dimension Metrology for 100-nm Linewidths and Below", Andrew Grenville, Brian Coombs, John Hutchinson, Kelin Kuhn, David Miller and Patrick Troccolo, Optical Microlithography XIII, Proceedings of SPIE Vol. 4000(2000), pages 452–459, describes electrical line width measurement for performing critical dimension measurements, setting forth the importance of understanding the relationship between physical line width and electrical line width, which will now be described.

FIG. 1 herein shows a typical electrical critical dimension (ECD) structure 20 for electrically measuring the width of a line 22, for example, a polysilicon line disposed on a silicon dioxide body 24 in turn provided on a crystalline silicon wafer 26 (FIGS. 1–4). The structure typically has test pads 28, 30, 32, 34 connected to the line 22 to be tested, and appropriate probes may be connected to the pads 28, 30, 32, 34 to run a variety of electrical tests, including application of electrical potential across the line 22, and measurement of current through the line 22. In accordance with the Grenville et al. paper, typically, ion implant 36 (FIG. 2) and anneal steps are undertaken to increase conductivity of the line 22, and then an electrical potential is applied to the line 22 and current therethrough is measured to indicate the width of the line 22. Due to dopant out diffusion 37 from the line 22 (FIG. 3), only the area 38 indicated as shown in FIG. 4 (having a width $W_1$, less than the physical width $W_2$ of the line 22) remains conductive. Thus, there exists a significant difference between physical line width $W_2$ and electrically measured line width $W_1$. Furthermore, with the amount of dopant lost through the walls of a line being substantially constant per unit of wall area, the relative loss of dopant for a narrower line 40 (FIGS. 5–7) will be greater than for a wider line 22. That is, after ion implantation 42 (FIG. 5) and anneal and dopant out diffusion 44 (FIG. 6), only the area 46 (having width $W_3$) indicated as shown in FIG. 7 remains electrically conductive. The width $W_3$ is a smaller proportion of the physical width $W_4$ of the line 40 than is the case in the structure of FIG. 4, i.e., $W_3/W_4 < W_1/W_2$.

FIG. 1 of the Grenville et al. paper discusses the bias between physical line width and electrically measured line width. While a bias of 90nm is indicated for past processes, this has previously not been a significant problem, since line widths of interest were 100 nm or larger. However, with line widths becoming smaller, the process as disclosed in the Grenville et al. paper has as its goal the reduction of this bias by varying the dopant and anneal process. Grenville et al. point out, however, that the penalty for practicing the disclosed process is increased sheet resistivity (on the order of fivefold). Furthermore, while the process appears to reduce the bias described above, a substantial bias still exists, and Grenville et al. point out that the ultimate goal would be to completely eliminate this bias, so as to eliminate the problems attendant thereto.

Therefore, what is needed is a process for electrically measuring linewidth wherein the problems associated with bias between physical linewidth and electrically measured linewidth are avoided.

SUMMARY OF THE INVENTION

In the present method of electrically testing the width of a line, a short pulse of laser energy is applied to the line to generate conductive electrons. An electrical potential is applied to the line to cause generated conductive electrons to flow, and current flow is measured to determine the width of the line.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

FIG. 12 includes FIGS. 12A–12D which are timing diagrams for use in conjunction with the processes illustrated in FIGS. 7–11.

DETAILED DESCRIPTION

Reference is now made in detail to specific embodiment of the present invention which illustrates the best mode presently contemplated by the inventors for practicing the invention.

Figure 8:
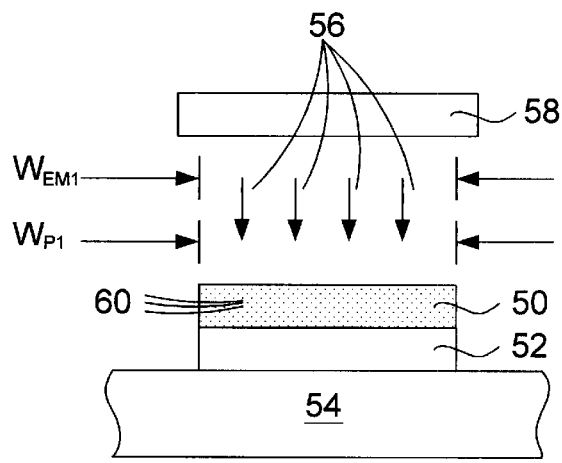
FIG. 8 is a sectional view showing a structure for illustration of the present process.

FIG. 8 shows a relatively wide (physical width $W_{p1}$) polysilicon line 50 disposed on an oxide body 52 in turn provided on a crystalline silicon wafer 54. A beam 56 from a laser 58 (for example an Excimer Nd-Yag laser) is applied to the polysilicon line 50 in the form of a short laser pulse (FIG. 8 and FIG. 12A, a graphical view of laser energy intensity I applied to be polysilicon line 50 plotted against time T). The photons from the laser beam 56 enter the line 50 and generate conductive electrons 60 inside the line 50, which previously included very few free electrons. The photons are sent from the laser 58 to the line 50 with sufficient energy to excite electrons in the polysilicon crystal lattice of the line 50 into the conduction band. Upon sufficient application of laser energy to the line 50, a relatively large number of conductive electrons 60 is generated in the line 50, substantially enhancing the conductivity of the line 50 (see FIG. 12B which is a graphical representation of number N of conductive electrons 60 generated in the line 50 by the laser beam 56 plotted against time T). As will be seen, during the actual pulse of laser energy, a substantial number N of conductive electrons 60 is built up in the line 50, which number declines with time after the laser pulse is ended as these electrons recombine into the lattice of the polysilicon.

Figure 1:
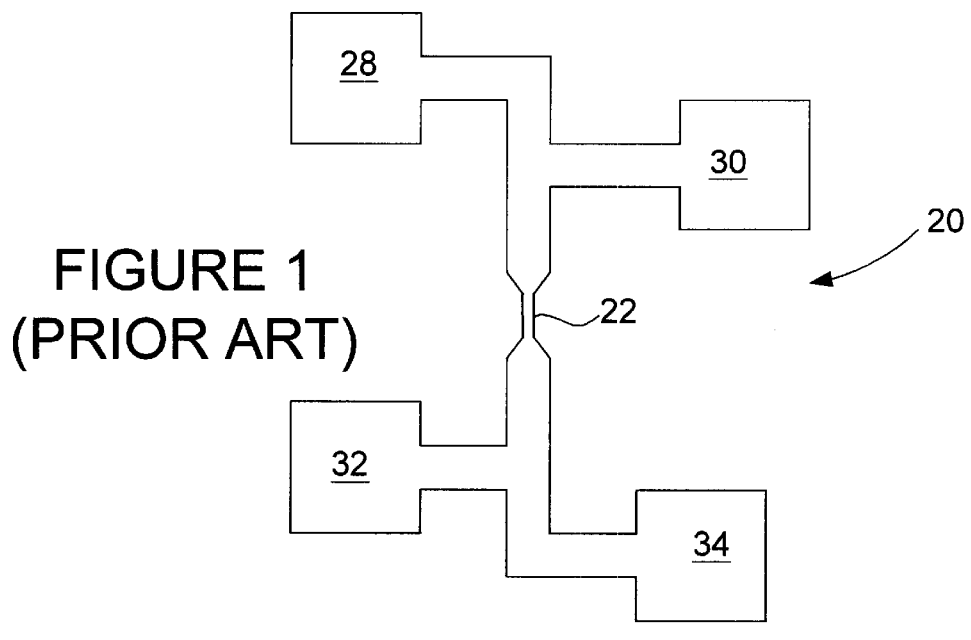
FIG. 1 illustrates a test structure for practicing the present invention.
Figure 2:
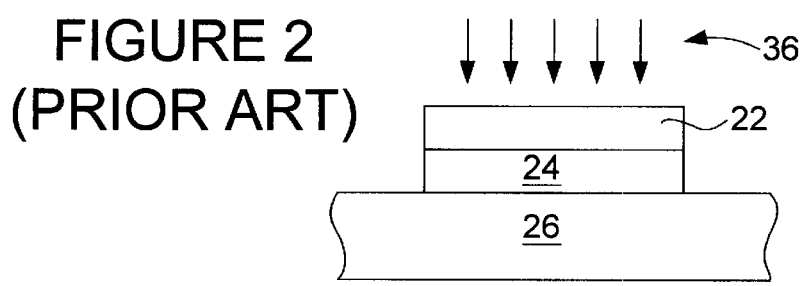
FIGS. 2–7 are cross-sectional views illustrating the practice of prior processes as described above.
Figure 3:
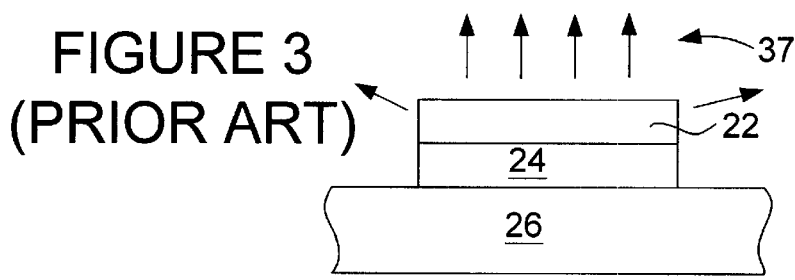
Figure 4:
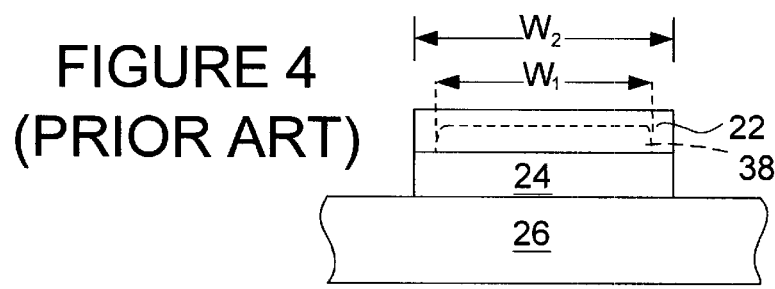
Figure 5:
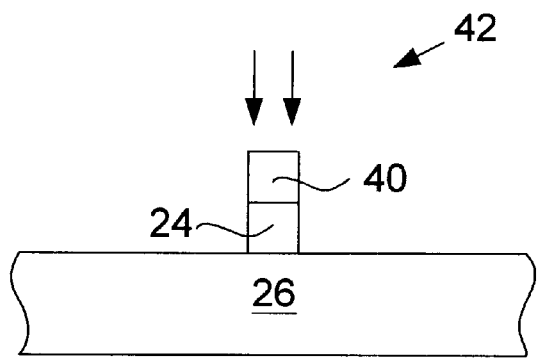
Figure 6:
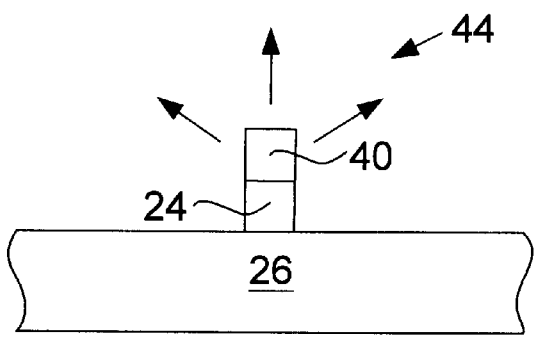
Figure 7:
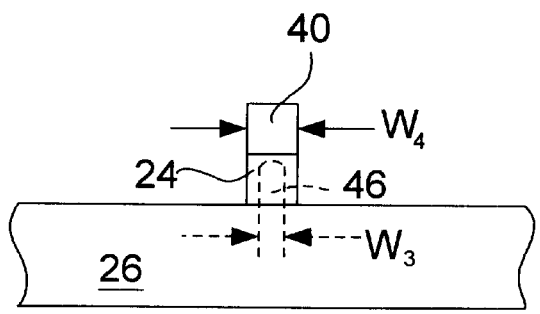

During the time period when a significant of generated free electrons exist in the line 50, and using, for example, the test structure 20 of FIG. 1, an electrical potential is provided to the line 50 (illustrated in side sectional view in FIG. 9), shown as +V and −V, to cause generated electrons to flow in the line 50 (indicated by arrow 51), which flow of electrons, i.e., current, can be measured by an appropriate current measuring device 53. The application of the electrical potential to the line 50, and the duration thereof, can take place as appropriate. For example, as shown in FIG. 12C, a graphical representation of level of electrical potential EP applied to the line 50 plotted against time T, the initial application of electrical potential to the line 50 occurs at substantially the same time as the initial application of laser energy to the line 50, and continues during application of the laser beam 56 (and laser energy) to the line 50. In the example shown in FIG. 12D, the initial application of electrical potential to the line 50 takes place after completion of the application of the laser beam 56 (and laser energy) to the line 50, but during that time when a significant number of generated electrons 60 still exist in the line 50.

Because the process of applying laser energy to the line 50 as above described causes the generated conductive electrons 60 to be distributed substantially evenly throughout the line 50 (FIG. 8), substantially the entire width $W_{p1}$ of the line 50 is conductive, so that physical line width $W_{p1}$, and electrically measured line width $W_{EM1}$, are substantially the same. Thus, the problem of bias between physical line width and electrically measured line width as set forth in the Grenville et al. paper is avoided.

Figure 10:
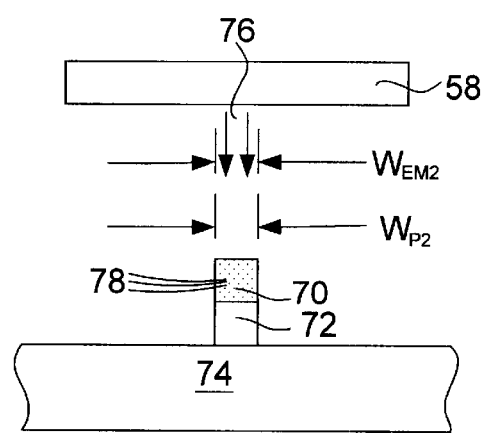
FIG. 10 is a sectional view showing another structure for illustration of the present process.

This is further illustrated with reference to FIG. 1, which shows a relatively narrow polysilicon line 70 (physical width $W_{p2}$) disposed on an oxide body 72 in turn provided on a crystalline silicon wafer 74. Again, a laser beam 76 in the form of a short pulse is applied to the polysilicon line 70 (FIG. 10). The photons of the laser beam 76 enter the line 70 and generate conductive electrons 78 inside the line 70 which previously included very few free electrons. Again, because the process of applying laser energy to the line as described above causes the generated electrons 78 to be distributed substantially evenly throughout the line 70, the entire physical width $W_{p2}$ of the line 70 is conductive, so that the physical line width $W_{p2}$ and electrically measured line width $W_{EM2}$ are substantially the same. Again, the problem of bias between physical line width and electrically measured line width (in this case with a very narrow line) is avoided.

Figure 9:
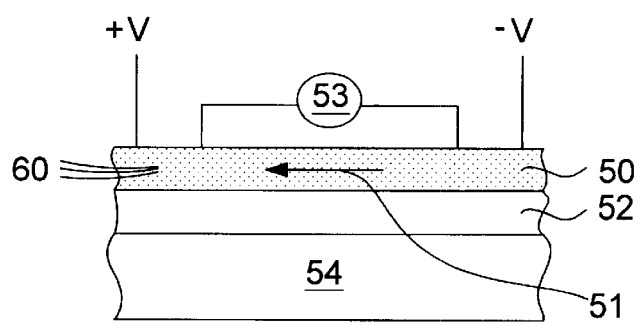
FIG. 9 is a sectional view taken along the line 9—9 of FIG. 8, showing a further step in the process.
Figure 11:
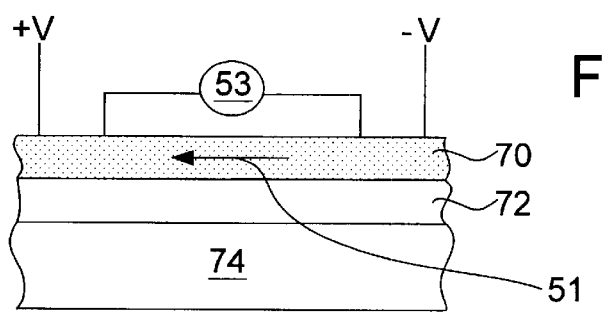
FIG. 11 is a sectional view taken along the line 11—11 of FIG. 10, showing a further step in the process.

FIG. 11 illustrates the application of an electrical potential to the line 70, similar to that shown in FIG. 9.

Typically, a laser pulse of moderate intensity applied for a period on for example from 5–30 ns will generate a number of photoelectrons proportional to the intensity of the pulse. Merely increasing the energy of the laser pulse in the hope of generating more photoelectrons (to provide a larger and more readily readable current during application of the electrical potential) may cause damage to be line structure. However, by using a very short laser pulse, for example, one picosecond, but keeping the applied laser energy level substantially the same (by increasing the intensity of the pulse), more photoelectrons will be generated in the line for the same amount of laser energy.

It will be seen that by practicing the present process, the entire problem of bias between physical line width and electrically measured line width is avoided. The process clearly lends itself to the testing of present very small line widths, and the even smaller line widths expected in the future.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated All such modifications and variations are within the scope of the invention as determined by the appended claims when interpreted in accordance with the breadth to which they are fairly, legally and equitably entitled.

What is claimed is:

1. A method of electrically determining the width of a line comprising:
    applying laser energy to the line to generate conductive electrons in the line;
    applying an electrical potential to the line to cause generated conductive electrons to flow in the line;
    measuring electrical current in the line; and converting measured electrical current value to a value representing line width.

2. The method of claim 1 wherein the laser energy is applied as a laser pulse.

3. The method of claim 2 and further comprising the step of providing that electrical potential is applied to the line during application of the laser pulse.

4. The method of claim 2 and further comprising the step of providing that the initial application of electrical potential to the line takes place after completion of the application of the laser pulse to the line.

5. The method of claim 1 and further comprising the step of providing that the line is a polysilicon line.

\* \* \* \* \*